(12) United States Patent
Kern et al.

(10) Patent No.: US 11,650,877 B2
(45) Date of Patent: May 16, 2023

(54) DETECTING ADDRESS ERRORS

(71) Applicant: Infineon Technologies AG, Neubiberg (DE)

(72) Inventors: Thomas Kern, Aschheim (DE); Klaus Oberlaender, Neubiberg (DE); Christian Badack, Unterhaching (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/881,473

(22) Filed: May 22, 2020

(65) Prior Publication Data
US 2020/0371864 A1    Nov. 26, 2020

(30) Foreign Application Priority Data
Mar. 24, 2019    (DE) ............... 10 2019 113 970.8

(51) Int. Cl.
| | |
|---|---|
| *G06F 11/10* | (2006.01) |
| *H03M 13/11* | (2006.01) |
| *G06F 11/34* | (2006.01) |
| *G06F 11/30* | (2006.01) |
| *H03M 13/13* | (2006.01) |
| *H03M 13/00* | (2006.01) |
| *H03M 13/19* | (2006.01) |

(52) U.S. Cl.
CPC ...... *G06F 11/1016* (2013.01); *G06F 11/1048* (2013.01); *G06F 11/3037* (2013.01); *G06F 11/34* (2013.01); *H03M 13/1174* (2013.01); *H03M 13/13* (2013.01); *H03M 13/19* (2013.01); *H03M 13/618* (2013.01)

(58) Field of Classification Search
CPC .. G06F 11/34; G06F 11/1016; G06F 11/1048; G06F 11/3073; H03M 13/13; H03M 13/19; H03M 13/618; H03M 13/2921
See application file for complete search history.

(56) References Cited

U.S. PATENT DOCUMENTS

| | | | |
|---|---|---|---|
| 6,711,705 B1 * | 3/2004 | Yasui | G11C 29/56 365/201 |
| 8,812,935 B2 | 8/2014 | Loewenstein | |
| (Continued) | | | |

FOREIGN PATENT DOCUMENTS

DE    2655653 A1    6/1978

OTHER PUBLICATIONS

Lin, Shu et al.; "Error Control Coding Fundamentals and Applications"; 1983 Prentice-Hall, Inc. Englewood Cliffs, NJ; ISBN 0-13-283796-X.

*Primary Examiner* — Shelly A Chase
(74) *Attorney, Agent, or Firm* — Eschweiler & Potashnik, LLC

(57) ABSTRACT

A method for detecting an address error when reading a bitstream from a memory is proposed, wherein a check is carried out as to whether the bitstream in conjunction with the present read address is a code word of an error code and wherein, should the bitstream in conjunction with the present read address not be a code word of the error code, an address error is subsequently detected provided the error code does not correct an error correctable thereby. Accordingly, an apparatus, a system and a computer program product are specified.

19 Claims, 4 Drawing Sheets

(56) References Cited

U.S. PATENT DOCUMENTS

| | | | |
|---|---|---|---|
| 2007/0061686 A1* | 3/2007 | Boehl | G11C 29/024 |
| | | | 714/777 |
| 2009/0024887 A1* | 1/2009 | Kimbara | G06K 19/07363 |
| | | | 714/722 |
| 2014/0040697 A1* | 2/2014 | Loewenstein | H03M 13/2921 |
| | | | 714/758 |
| 2015/0007001 A1* | 1/2015 | Kern | H03M 13/616 |
| | | | 714/785 |
| 2017/0046223 A1* | 2/2017 | Kern | G11C 11/1677 |

\* cited by examiner

DETECTING ADDRESS ERRORS

REFERENCE TO RELATED APPLICATION

This application claims priority to German Application No. 10 2019 113 970.8, filed on May 24, 2019, the contents of which are hereby incorporated by reference in their entirety.

BACKGROUND

Reliably storing data in addressable memories generally is of great interest. As a result of the reduction in size of memory structures and as a result of the development of novel memory cells, such as MRAM cells, RRAM cells and other memory cells that have comparatively high error rates for certain applications in particular, it is necessary to detect and correct errors. This relates to bit errors, which should be detected and corrected, memory cell errors which should be detected (with the highest possible probability) and address errors which likewise should be detected (with the highest possible probability).

For the error correction of bit errors, use can be made of error-correcting codes such as, for example, Hamming codes, Hsiao codes or BCH codes.

In particular, memory cell errors refer to those errors in which all memory cells considered adopt a certain value, for example a value of 0 or a value of 1. If all memory cells adopt a value of 0, a so-called "all 0" memory cell error is present. If all memory cells adopt a value of 1, a so-called "all 1" memory cell error is present. A memory cell error may also be present if different memory cells adopt different values, for example successive 01 pairs. Other faulty memory cell occupancies are also possible.

By way of example, a memory cell error $\varphi$ can be described by binary values $\varphi1$ to $\varphi n$ in n memory cells. The all 0 memory cell error corresponds to $$\varphi_1=0, \varphi_2=0, \ldots \varphi_n=0$$

and the all 1 memory cell error corresponds to $$\varphi_1=1, \varphi_2=1, \ldots \varphi_n=1.$$

In relation to detecting address error, U.S. Pat. No. 8,560,899 B2 has disclosed the determination of an active memory address using excited wordlines and excited bitlines, for example using a ROM, and the comparison thereof with the memory address actually present.

SUMMARY

The present disclosure is directed to improving existing solutions and, in particular, also to detecting address errors for arbitrary error codes.

In particular, an error code refers to an error-detecting and/or error-correcting code.

A method is disclosed for detecting an address error when reading a bitstream from a memory,
wherein a check is carried out as to whether the bitstream in conjunction with the present read address is a code word of an error code,
wherein, should the bitstream in conjunction with the present read address not be a code word of the error code, an address error is subsequently detected provided the error code does not correct an error correctable thereby.

In this case, it should be noted that an error correctable by the error code can be any error to be corrected.

It should further be noted that the term code word denotes a valid occupancy of bits according to a specified code. Consequently, the code word satisfies the properties of the code.

The code (also referred to as error code) can be an error-detecting code and/or an error-correcting code.

The memory can comprise any one of the following memories: floating gate cells, PCRAM, RRAM, MRAM, MONOS components, nanocrystal cells, ROM.

In one development, the error to be corrected by the error code is a subset of the errors correctable by the error code.

In one development, no address error is detected should the bitstream in conjunction with the present read address be a code world of the error code.

In one development, a memory cell error in the bitstream is detected and/or corrected by means of the error code.

In one development, the memory cell error is detected and/or corrected by means of a first error syndrome.

In one development, the address error is detected by means of a second error syndrome, the first error syndrome differing from the second error syndrome.

In one development, before reading the bitstream from the memory, the following steps are performed:
  storing a bitstream v at an address a in the memory, the bitstream v and an address value f(a) transformed by means of a transformation f representing a code word of the error code,
  assigning the used memory address a to the transformed address value f(a)=A1, . . . , Am, where the transformed address value f(a) is different from an error syndrome of the memory cell error and different from values arising from error syndromes assigned to bit errors.

In one development, not all addresses of the memory are used.

In one development, the memory has memory cells, in which n-component bitstreams are storable, wherein N different bit errors b1 to bN, which falsify a bitstream v=v1, . . . , vn into bitstreams v(b1), v(b2), . . . , V(bN), are correctable, wherein a memory cell error $\varphi^1$, in which n memory cells yield the values $\varphi_1^1, \ldots, \varphi_n^1=\varphi^1$ upon readout from the memory cells, is detected,
  wherein the bitstream v, which is written into the memory at an address a, is determined in such a way that in an error-free case [v,f(a)] is a code word of the error code Ca with an H-matrix $H=(H_{m,n}^v, I_m)$,
  wherein an address transformation f is determined in such a way that it uniquely assigns a transformed address value f(a)=A1, . . . , Am to each used memory address a, which transformed address value is not equal to the values $$H_{m,n}^v \cdot \varphi^1, H_{m,n}^v \cdot \varphi^1 + s(b^1), \ldots, H_{m,n}^v \cdot \varphi^1 + s(b^N)$$

where s(b1) to s(bN) are error syndromes assigned to the bit errors,
wherein the following relationships apply:

$$2^m > N+1, n \geq 2, m \geq 2, N \geq 1$$

where $H_{m,n}^v$ denotes a binary (m,n)-matrix and Im denotes the m-dimensional unit matrix.

In one development, a further memory cell error $\varphi^2$ is detected, where n memory cells addressed at one address yield the values $\varphi_1^2, \ldots, \varphi_n^2=\varphi^2$ when reading from the memory cells, and the address transformation f is determined in such a way that the transformed address value f(a) for each used memory address a is not equal to the values $$H^v \cdot \varphi^2, H^v \cdot \varphi^2 + s(b^1), \ldots, H^v \cdot \varphi^2 + s(b^N).$$

In one development, the matrix $H_{m,n}^v$ is an H-matrix of a Hamming code or a shortened Hamming code.

In one development, the matrix $H_{m,n}^v$ is an H-matrix of a Hsiao code or a shortened Hsiao code.

In one development, the matrix $H_{m,n}^v$ is an H-matrix of a t bit error correcting code.

In one development, the matrix $H_{m,n}^v$ is an H-matrix of a BCH code.

In one development, for the purposes of increasing the probability of detecting an address error, the H-matrix $$H=[H_{m,n}^v, I_m]$$

of an error code is changed into a modified H-matrix $$H=[H_{m+1,n}^v, I_{m+1}]$$

by virtue of an (m+1)-th row of n binary values being added to the H-matrix $H_{m,n}^v$.

In one development, the (m+1)-th row, which is added to the matrix $H_{m,n}^v$, comprises n zeros.

Furthermore, an apparatus is proposed for detecting an address error, wherein the apparatus comprises a processing unit configured in such a way that a check is carried out as to whether a bitstream in conjunction with the present read address is a code word of an error code, should the bitstream in conjunction with the present read address not be a code word of the error code, an address error is subsequently detected provided the error code does not correct an error correctable thereby.

The processing unit specified here can be embodied, in particular, as a processor unit and/or an at least partly hardwired or logic circuit arrangement, which is configured in such a way, for example, that the method as described herein is performable. Said processing unit can be or comprise any type of processor or computing device or computer with appropriate required periphery (memory, input/output interfaces, input-output devices, etc.)

In particular, the processing unit is configured to be able to carry out the steps of the method described herein.

The explanations made above in relation to the method apply analogously to the apparatus.

In one development, the processing unit is configured to read the bitstream from a memory.

Additionally, a system is specified, comprising at least one apparatus as described herein.

Further, a computer program product is specified, which is directly loadable into a memory of a digital computer, comprising program code parts suitable for performing steps of the method described herein.

Furthermore, the aforementioned problem is solved by means of a computer readable storage medium, e.g., of any memory, comprising computer-executable instructions (e.g., in the form of program code), which are suitable to cause the computer to perform steps of the method described herein.

The above-described properties, features and advantages of this disclosure and the manner in which they are achieved are described below in conjunction with a schematic description of example embodiments, which are explained in more detail in conjunction with the drawings. Here, for the sake of a better overview, the same elements and elements with the same effect may be provided with the same references.

BRIEF DESCRIPTION OF THE DRAWINGS

In detail.

DETAILED DESCRIPTION

Figure 1:
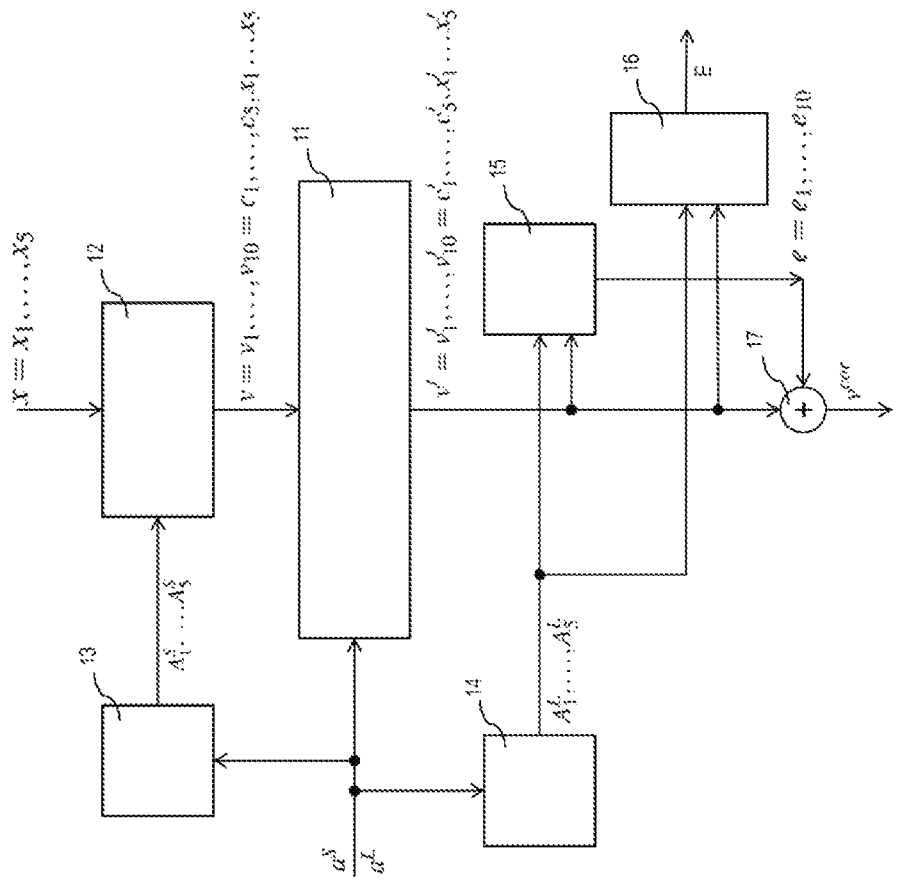
FIG. 1 shows an example circuit arrangement for storing and correcting data.

By way of example, determining an error code Ca and an address transformation f is proposed for the purposes of transforming addresses of an addressable memory into transformed address values. In one embodiment, the addressable memory comprises memory cells that are used to store n-component bitstreams.

By way of example, N different bit errors b1 to bN are correctable, said bit errors falsifying a bitstream v into bitstreams v(b1), v(b2), . . . , V(bN). A memory cell error $\varphi^1$ can be reliably detected, wherein the following applies to n memory cells:

$$\varphi_1^1, \ldots, \varphi_n^1 = \varphi^1.$$

By way of example, this can be achieved as follows:

The bitstream $v=v1, \ldots, vn$, which is written into the memory at an address a, is determined in such a way that in an error-free case $$[v, f(a)]$$

is a code word of the error code Ca, wherein the error code Ca has an H-matrix $H=(H_{m,n}^v, I_m)$.

The address transformation f is determined in such a way that it uniquely assigns a transformed address value $$f(a)=A1, \ldots, Am$$

to each used memory address a, which transformed address value is not equal to the values $$H_{m,n}^v \cdot \varphi^1, H_{m,n}^v \cdot \varphi^1 + s(b^1), \ldots, H_{m,n}^v \cdot \varphi^1 + s(b^N)$$

where s(b1), . . . , s(bN) are error syndromes assigned to the bit errors b1 to bN.

By way of example, the following apply: $2^m > N+1$, $n \geq 2$, $m \geq 2$ and $N \geq 1$.

The matrix $H_{m,n}^v$ is, in one embodiment, a binary (m,n)-matrix. The matrix Im is the m-dimensional unit matrix.

By way of example, the address transformation can be performed by means of at least one of the following components: an address transformation circuit, a program, a microcontroller, a processor or a processing unit realized using any hardware and/or software.

The error code Ca is determined in such a way that it can detect at least one memory cell error $\varphi^1$ independently of the address used. By way of example, the memory cell error is an all 0 error or an all 1 error. Each of these errors can be detected reliably.

The error code and the address transformation are, in one embodiment, determined in such a way that, independently of the address present, a memory cell error in the n memory cells does not lead to an error syndrome of a correctable error or to the 0 error syndrome.

The N different bit errors b1, . . . , bN in the bitstream v can be 1-bit errors, 2-bit errors or other errors, for example.

If the memory cell error $\varphi^1$ is present, then the values $\varphi_1^1, \ldots, \varphi_n^1$ are present at the n data output lines, which correspond to the n memory cells, independently of the values previously written into these memory cells.

In the case of a memory cell error, the n memory cells could adopt the faulty values $$\varphi_1^1, \ldots, \varphi_n^1.$$

Below, the assumption is made that the memory cell error $\varphi^1$ is present if the values of the lines of a bus, to which memory cells are connected, adopt the values $\varphi_1^1, \ldots, \varphi_n^1$ without the values stored in the memory cells themselves necessarily being faulty. By way of example, all values on the lines could adopt a value of 0.

Examples of memory cell errors include the all 0 error with $\varphi^{All-0} = \underbrace{0 \ldots 0}_{n}$ and the all 1 error with $\varphi^{All-1} = \underbrace{1 \ldots 1}_{n}$.

Other memory cell errors, in which the memory cells do not all provide the same value, may also occur, e.g., $$\varphi = \underbrace{1010 \ldots 10}_{n}.$$

The error code Ca is able to detect at least one address error that falsifies an address a into a faulty address a'.

The transformed address values f(a) have m components $$A1, \ldots, Am = f(a),$$

where the transformed address values A1 to Am are binary values, for example.

The H-matrix H of the error code Ca can be determined in such a way that an m-dimensional unit matrix is added to an (m,n)-matrix Hm,n, which can be chosen, for example, as an H-matrix of an (n,n−m)-error code C of the length of n with m check bits for correcting the bit errors b1, . . . , bN in the bitstream v, such that the following applies:

$$H = (H_{m,n}^v, I_m).$$

By way of example, the first n columns of the H-matrix H correspond to the n bits of the bitstream v=v1, . . . , vn and the appended m columns of the appended unit matrix Im correspond to the transformed address values A1, . . . , Am. Here [v,f(a)] is determined in the error-free case in such a way that the following applies:

$$H \cdot [v, f(a)] = [H_{m,n}^v, I_m] \cdot [v, f(a)] = [H_{m,n}^v, I_m] \cdot [v_1, \ldots, v_n, A_1, \ldots, A_m] = 0.$$

In the error-free case, [v,f(a)] is a code word of the error code Ca.

If a matrix is right-multiplied by a vector, the vector is a column vector in this case. If a matrix is left-multiplied by a vector, the vector is a row vector.

If it should be highlighted that a vector [v] is a column vector, it may be denoted by [v]T.

If the bitstream v=v1, . . . , vn is disturbed into a faulty bitstream $$v' = v'_1, \ldots, v'_n$$

with $$v + v' = v_1 + v'_1, \ldots, v_n + v'_n = e_1, \ldots, e_n = e$$

by a bit error bi, the error syndrome s(bi) of the bit error bi is:

$$s(b_i) = H \cdot [v', f(a)]$$
$$= [H_{m,n}^v, I_m] \cdot [v' + v + v, f(a) + 0]$$
$$= [H_{m,n}^v] \cdot [v' + v] + [H_{m,n}^v] \cdot v + f(a)$$
$$= [H_{m,n}^v] \cdot [v' + v] + [H_{m,n}^v, I_m] \cdot [v, f(a)]$$
$$= [H_{m,n}^v] \cdot [e].$$

What is exploited here is that v+v=0 applies and that + denotes a component-by-component addition modulo 2 or the logical XOR (exclusive or) operation.

The address transformation f is determined in such a way that the transformed m-component address values A1, . . . , Am=f(a) for any possible memory address a differ from all (N+1) m-component values $$H_{m,n}^v \cdot \varphi^1, H_{m,n}^v \cdot \varphi^1 + s(b_1), \ldots, H_{m,n}^v \cdot \varphi^1 + s(b_N). \qquad (1)$$

Here, $$s(b_1), \ldots, s(b_N)$$

are error syndromes s(b1), . . . , s(bN) assigned to the possible bit errors b1, . . . , bN of bits in the bitstream v. Furthermore, "+" denotes the component-by-component XOR operation.

The syndromes s(b1), . . . , s(bN) of the bit errors b1, . . . , bN could correspond to 1-bit errors, 2-bit errors or other errors in the bits of the bitstream v.

Consequently, what can advantageously be obtained is that, for the memory cell error $\varphi^1$ and for any used address a, the error syndrome occurring in the case of the memory cell error $\varphi^1$ $$[H_{m,n}^v, I_m] \cdot [\varphi^1, f(a)] = H_{m,n}^v \cdot \varphi^1 + f(a)$$

with $$[\varphi^1, f(a)] = [\varphi^1, \ldots, \varphi^n, A_1, \ldots, A_m]$$

is not equal to the error syndromes of the correctable bit errors and not equal to the 0 error syndrome.

It is possible that only some of all possible memory addresses of the memory are used in certain applications. These used memory addresses are also referred to as used (memory) addresses. Memory addresses that are not used can also be referred to as unused (memory) addresses.

Providing nothing else is specified, the term memory address may refer below to all memory addresses or to all used memory addresses.

One option would be to set the transformation of the addresses into transformed address values only for used memory addresses and not to separately set the transformed address values for unused addresses, or else to assign non-determined or predetermined values to the unused addresses.

By way of example, if an address transformation f is realized by a combinatorial circuit, addresses whose transformed address values are assigned as non-determined values can be optimized within the scope of a circuit synthesis.

In general, there are 2 m different m-digit binary vectors and the transformed address values f(a) can adopt at most $$Q = 2^m - N - 1 > 0$$

different m-component values. As result of the address transformation f, a possible memory address is mapped to one of these Q possible transformed address values, which is not equal to the error syndromes specified in equation (1).

One option would be to map a plurality of groups of memory addresses per group onto a specified transformed address value. By way of example, a number Anz1 of memory addresses can be mapped to a first value of transformed address values, a number Anz2 of memory addresses can be mapped to a second value of transformed address values, etc., right down to a number AnzQ of memory addresses, which are mapped to a Q-th value of the transformed address values.

Here, the Q numbers, Anz1, Anz2, AnzQ, could only differ by 1 and $$Anz_1 \approx Anz_2 \approx \ldots \approx Anz_Q \approx Anz$$

applies. As a result of such an assignment of the memory addresses to the transformed address values, (approximately) the same number of memory addresses are assigned to the different values of the transformed address values in each case. If $2^K$ memory addresses are present, then $$Anz \approx \frac{2^K}{Q} = \frac{2^K}{2^m - N - 1} \quad (2)$$

memory addresses are assigned to one transformed address value.

If an address error falsifies an address a into an address a', a bitstream v' is read at the address a'.

[v', f(a)'] is a code word of the considered error code and the following applies:

$$H \cdot [v', f(a)'] = H \cdot [v'_1, \ldots, v'_n, A'_1, \ldots, A'_m] = 0. \quad (3)$$

An address error, in which an address a is incorrectly disturbed into an address a' cannot be detected if $$H \cdot [v', f(a)] = H \cdot [v'_1, \ldots, v'_n, A_1, \ldots, A_m]$$

is an element of the set $$\{0, s(b1), \ldots, s(bN)\}.$$

In such a case, an address error would have an error syndrome that could not be distinguished from the error syndrome of one of the correctable errors or from the 0 error syndrome. If the 0 error syndrome occurs, no error can be detected.

On account of equation (3) and on account of $$f(a')+f(a')=[A'_1, \ldots, A'_m]+[A'_1, \ldots, A'_m]=0, \ldots, 0=0$$

the following applies:

$$H \cdot [v', f(a)] = H[v'_1, \ldots, v'_n, A_1, \ldots, A_m] \quad (4)$$

$$== H \left\{ \begin{array}{l} [v'_1, \ldots, v'_n, A_1, \ldots, A'_m] + \\ [0, \ldots, 0, A'_1, \ldots A'_m] + \\ [0, \ldots, 0, A'_1, \ldots A'_m] \end{array} \right\}$$

$$== H \left\{ \begin{array}{l} [v'_1, \ldots, v'_n, A_1, \ldots, A'_m] + \\ [0, \ldots, 0, A'_1, \ldots A'_m] + \\ [0, \ldots, 0, A_1, \ldots A_m] \end{array} \right\}$$

$$== H \cdot [v'_1, \ldots, v'_n, A'_1, \ldots, A'_m] +$$

$$H \cdot [0, \ldots, 0, A_1, \ldots, A_m] +$$

-continued $$H \cdot [0, \ldots, 0, A'_1, \ldots, A'_m]$$

$$== \underbrace{[0, \ldots, 0]}_{m} + [A_1, \ldots, A_m] + [A'_1, \ldots, A'_m]$$

$$= f(a) + f(a').$$

Consequently, the address error is not detected if f(a)+f(a') is an element of the set $$\{0, s(b1), \ldots, s(bN)\},$$

i.e., if $$f(a)+f(a') \in \{0, s(b1), \ldots, s(bN)\}$$

applies or if f(a') is an element of the set $$\{f(a), s(b1)+f(a), \ldots, s(bN)+f(a)\}.$$

Expressed differently: an address error which falsifies the address a into the address a' cannot be detected if f(a') adopts a value that equals one of the values $$0+f(a), s(b1)+f(a), \ldots, s(bN)+f(a) \quad (6)$$

Since f(a') is the transformed address value of a memory address a', f(a'), according to equation (1), also differs from the (N+1)-values $$H_{m,n}{}^v \cdot \varphi^1, H_{m,n}{}^v \cdot \varphi^1 + s(b_1), \ldots, H_{m,n}{}^v \cdot \varphi^1 + s(b_N).$$

It is possible that the (N+1)-values described by equation (6) and the values described by equation (1) have common values, and so fewer than (N+1)-values for which an address error which falsifies the address a into the address a' is not detected may be present for f(a').

Consequently, there are at most (N+1) transformed address values of the total of (2m−N−1) transformed address values where an address error that falsifies the address a into the address a' is not detected.

The following applies to the probability P(a,a')nd that the described address error is not detected:

$$P(a, a')_{nd} \leq \frac{N+1}{2^m - N - 1} \quad (7)$$

and the following applies to the probability P(a,a')det that an address error that falsifies the address a into any address a' is detected:

$$P(a, a')_{det} \geq 1 - \frac{N+1}{2^m - N - 1}. \quad (8)$$

The (m,n)-matrix $H_{m,n}{}^v$ can be an H-matrix of an (n,n−m)-error code, for example. In particular, one option would be for the error code to be a 1-bit error correcting and 2-bit error detecting code, e.g., a Hsiao code with an odd number of ones of the columns of the (m,n)-matrix $H_{m,n}{}^v$.

In one embodiment, a probability P(a,a')det for detecting an address error is greater than or equal to a specified value, for example 0.5 or 0.9. Thus, the value m can be increased incrementally until the desired value for the probability P(a,a')det according to equation (8) is reached. This will be explained in more detail below in example fashion. Here, m also denotes the number of required check bits of the used error code.

By way of example, in the case of a Hsiao code, instead of the H-matrix $H_{m,n}^v$ of a shortened Hsiao code with m rows and n columns and m check bits, use can incrementally be made of an H-matrix $H_{m+1,n}^v$ of a shortened Hsiao code with m+1 rows and n columns, which is complemented by an identity matrix Im+1, with m+1 check bits, an H-matrix $H_{m+2,n}^v$ of a shortened Hsiao code with m+2 rows and n columns, which is complemented by an identity matrix Im+2, with m+2 check bits, etc. In this case, N=n, for example.

Accordingly, a further error code, for example a Hamming code, a shortened Hamming code or any other error code, can be used.

By way of example, the matrix $H_{m+1,n}^v$ can be determined from the matrix $H_{m,n}^v$ by virtue of a row of n zeros being added to the matrix $H_{m,n}^v$. Accordingly, the matrix $H_{m+2,n}^v$ can be determined from the matrix $H_{m+1,n}^v$ by virtue of a row of n zeros being added to the matrix $H_{m+1,n}^v$.

On account of the address transformation explained here, it is advantageously possible to determine the error code in such a way that the probability of detecting any address error is efficiently adapted to a specified or desired value. Furthermore, it may be that the probability of detecting an arbitrary address error is substantially the same for all possible address errors.

A development comprises a further memory cell error $\varphi^2$ being detected, where, in example fashion, n memory cells addressed at one address yield the values $$\varphi_1^2, \ldots, \varphi_n^2 = \varphi^2$$

when reading at the data outputs of the memory cells. Here, the address transformation f could be determined in such a way that the m-dimensional transformed address value f(a) for each used memory address a is not equal to the likewise m-dimensional values $$H_{m,n}^v \cdot \varphi^2, H_{m,n}^v \cdot \varphi^2 + s(b^1), \ldots, H_{m,n}^v \cdot \varphi^2 + s(b^N).$$

It is possible that at least two memory cell values $\varphi^1$ and $\varphi^2$ are faulty. Moreover, further memory cell values may also be faulty and detected as faulty.

By way of example, an address transformation f(a) is determined for memory cell values that can be described by any n-dimensional binary vector.

It is possible that $H^v \cdot \varphi^1 = H^v \cdot \varphi^2$ and hence $$\{H_{m,n}^v \cdot \varphi^2, H_{m,n}^v \cdot \varphi^2 + s(b^1), \ldots, H_{m,n}^v \cdot \varphi^2 + s(b^N)\} = \{H_{m,n}^v \cdot \varphi^1, H_{m,n}^v \cdot \varphi^1 + s(b^1), \ldots, H_{m,n}^v \cdot \varphi^1 + s(b^N)\}$$

applies. In such a case, it is possible to determine the same address transformation f(a) which can also be determined if only a single memory cell error occurs.

By way of example, if $$\varphi^1 = \text{All} - 0 = \underbrace{0 \ldots 0}_{n} \text{ and } \varphi^2 = \text{All} - 1 = \underbrace{1 \ldots 1}_{n}$$

and if the matrix $H_{m,n}^v$ has an even number of ones in each of its rows, then $$H_{m,n}^v \cdot [\text{All} - 0] = H_{m,n}^v \cdot [\text{All} - 1] = \underbrace{0, \ldots, 0}_{m}$$

and the address transformation f(a), which was determined for the memory cell error $\varphi^1 = \text{All} - 0$ can also be used for the case where both the memory cell error $\varphi^1 = \text{All} - 0$ and the memory cell error $\varphi^2 = \text{All} - 1$ should be detected.

If $$\{H_{m,n}^v \cdot \varphi^2, H_{m,n}^v \cdot \varphi^2 + s(b^1), \ldots, H_{m,n}^v \cdot \varphi^2 + s(b^N)\} \neq \{H_{m,n}^v \cdot \varphi^1, H_{m,n}^v \cdot \varphi^1 + s(b^1), \ldots, H_{m,n}^v \cdot \varphi^1 + s(b^N)\},$$

then the address transformation f is determined in such a way that the transformed m-component address values $$A1, \ldots, Am = f(a)$$

for any possible memory address a differs from all (N+1) m-component values $$H_{m,n}^v \cdot \varphi^1, H_{m,n}^v \cdot \varphi^1 + s(b_1), \ldots, H_{m,n}^v \cdot \varphi^1 + s(b_N) \quad (9)$$

and from all (N+1) m-component values $$H_{m,n}^v \cdot \varphi^2, H_{m,n}^v \cdot \varphi^2 + s(b_1), \ldots, H_{m,n}^v \cdot \varphi^2 + s(b_N) \quad (10)$$

as well.

One option is that the matrix $H_{m,n}^v$ is the H-matrix of a Hamming code or a shortened Hamming code of length n with m check bits.

The H-matrix of a non-shortened Hamming code with m check bits has all pairwise different (2m−1) binary vectors not equal to $$\underbrace{0, \ldots, 0}_{m}$$

as columns.

An H-matrix $H_{m,n}^v$ of any linear code of length n with m check bits and n pairwise different columns can be determined from the H-matrix of a non-shortened Hamming code with m check bits by deleting columns. In one embodiment, those columns which do not occur as columns in the H-matrix $H_{m,n}^v$ are deleted in the process. A code is shortened by deleting columns of the H-matrix of the code. Expressed differently: deleting columns of the H-matrix of a non-shortened Hamming code can be used to determine the H-matrix of any linear code with m check bits. A linear code is uniquely determined by its H-matrix.

Another option is that the matrix $H_{m,n}^v$ is the H-matrix of a Hsiao code or a shortened Hsiao code.

A further option is that the matrix $H_{m,n}^v$ is the H-matrix of a t bit error correcting code. Here, t is greater than or equal to 1, in particular. If t equals 1, use can be made of a Hamming code or a Hsiao code. If t is greater than or equal to two, use can be made of a t bit error correcting BCH code.

A development comprises the matrix $H_{m,n}^v$ being the H-matrix of a BCH code.

According to a further development and for the purposes of increasing the probability of detecting an address error, the H-matrix $$H = [H_{m,n}^v, I_m]$$

of an error code is changed into a modified H-matrix $$H = [H_{m+1,n}^v, I_{m+1}],$$

where $H_{m+1,n}^v$ is formed from $H_{m,n}^v$ by virtue of an (m+1)-th row of n binary values being added to $H_{m,n}^v$. Another option is that the (m+1)-th row, which is added to the matrix $H_{m,n}^v$, comprises n zeros.

FIG. 1 shows an example circuit arrangement for storing data. To this end, the circuit arrangement comprises a coder 12 with a first input for inputting used data bits x=x1, . . . , x5, a second input for inputting transformed address bits $A_1^S, \ldots, A_5^S$ and an output for outputting the bits to be stored (also referred to as bitstream)

$$v = v1, \ldots, v10 = c1, \ldots, c5, x1, \ldots, x5$$

where the bits c1 to c5 represent check bits, a first address transformation circuit 13 with an input for inputting a write address $a^S = a_1^S, \ldots, a_6^S$ and an output for outputting the transformed address bits $A_1^S$ to $A_5^S$ of the write address, a memory 11 with a data input for inputting the bits v to be stored provided by the coder 12, an address input for inputting a memory address, i.e., a write address aS or a read address aL, and a data output for outputting possibly incorrectly stored bits (also referred to as a bitstream)

$$v' = v'1, \ldots, v'10 = c'1, \ldots, c'5, x'1, \ldots, x'5,$$

a second address transformation circuit 14 with an input for inputting the read address $a^L = a_1^L, \ldots, a_6^L$ and an output for outputting transformed address bits $A_1^L, \ldots, A_5^L$ of the read address, a corrector 15 with a first input for inputting the transformed address bits $A_1^L, \ldots, A_5^L$, a second input for inputting the possibly faulty bits v' provided by the memory 11 and an output for outputting correction values e1, . . . , e10 for correcting the possibly faulty bits v', an error detection circuit 16 with a first input for inputting the transformed address bits $A_1^L, \ldots, A_5^L$, a second input for inputting the possibly faulty bits v' provided by the memory 11 and an output for outputting an error signal E and an XOR circuit 17 with a first input for inputting the possibly faulty bits v' output by the memory 11, a second input for inputting the correction values e1, . . . , e10 output by the corrector 15 and an output for outputting corrected bits $$v^{cor} = v_1^{cor}, \ldots, v_{10}^{cor} = c_1^{cor}, \ldots, c_5^{cor}, x_1^{cor}, \ldots, x_5^{cor}.$$

Depending on the used data bits x=x1, . . . , x5 and transformed address bits $f(aS) = A_1^S, \ldots, A_5^S$ present at the inputs of the coder 12, the latter is configured to form and output at its output bits to be stored v=v1, . . . , v10 such that $$v, f(aS) = v1, \ldots, v10, A_1^S, \ldots, A_5^S$$

is a code word of an error code Ca.

In the embodiment chosen here, an H-matrix $H = H_{5,10}^v, I_5$ of the code Ca equals $$H = (H_{5,10}^v, I_5) = = \quad (11)$$

$$\begin{pmatrix} 1 & 0 & 0 & 1 & 0 & 1 & 1 & 1 & 1 & 0 & 1 & 0 & 0 & 0 & 0 \\ 0 & 1 & 0 & 1 & 1 & 1 & 1 & 0 & 0 & 1 & 0 & 1 & 0 & 0 & 0 \\ 1 & 1 & 1 & 0 & 1 & 0 & 1 & 1 & 0 & 0 & 0 & 0 & 1 & 0 & 0 \\ 0 & 0 & 1 & 1 & 1 & 0 & 0 & 1 & 1 & 1 & 0 & 0 & 0 & 1 & 0 \\ 1 & 1 & 1 & 0 & 0 & 1 & 0 & 0 & 1 & 1 & 0 & 0 & 0 & 0 & 1 \\ c_1 & c_2 & c_3 & c_4 & c_5 & x_1 & x_2 & x_3 & x_4 & x_5 & A_1 & A_2 & A_3 & A_4 & A_5 \end{pmatrix}$$

The bottom row of the H-matrix of equation (11) lists the variables corresponding to the columns of the H-matrix. The matrix $$H_{5,10}^v = \begin{pmatrix} 1 & 0 & 0 & 1 & 0 & 1 & 1 & 1 & 1 & 0 \\ 0 & 1 & 0 & 1 & 1 & 1 & 1 & 0 & 0 & 1 \\ 1 & 1 & 1 & 0 & 1 & 0 & 1 & 1 & 0 & 0 \\ 0 & 0 & 1 & 1 & 1 & 0 & 0 & 1 & 1 & 1 \\ 1 & 1 & 1 & 0 & 0 & 1 & 0 & 0 & 1 & 1 \end{pmatrix}$$

is the H-matrix of a (10,5)-Hsiao code, in which all columns of this matrix have an odd number of three ones.

From the H-matrix shown in equation (11), linear combinations of rows can be used to determine the systematic form of the H-matrix Hsys of the code Ca, as per:

$$H_{sys} = \quad (12)$$

$$\begin{pmatrix} 1 & 0 & 0 & 0 & 0 & 0 & 1 & 1 & 0 & 1 & 0 & 1 & 0 & 1 & 1 \\ 0 & 1 & 0 & 0 & 0 & 1 & 0 & 1 & 0 & 1 & 1 & 0 & 1 & 1 & 0 \\ 0 & 0 & 1 & 0 & 0 & 0 & 1 & 0 & 1 & 1 & 1 & 1 & 1 & 0 & 0 \\ 0 & 0 & 0 & 1 & 0 & 1 & 0 & 0 & 1 & 1 & 1 & 1 & 0 & 1 & 1 \\ 0 & 0 & 0 & 0 & 1 & 1 & 1 & 1 & 1 & 1 & 0 & 0 & 1 & 0 & 1 \\ c_1 & c_2 & c_3 & c_4 & c_5 & x_1 & x_2 & x_3 & x_4 & x_5 & A_1 & A_2 & A_3 & A_4 & A_5 \end{pmatrix}.$$

Again, the variables corresponding to the columns of the H-matrix are listed in the last row of the H-matrix shown in equation (12): the first five columns correspond to the check bits c1, . . . , c5, the next five columns correspond to the used data bits x1, . . . , x5 and the last five columns of the H-matrix Hsym as per equation (12) correspond to the transformed address bits A1, . . . , A5.

If there is writing to memory, then the bits A1 to A5 correspond to the transformed bits $A_1^S$ to $A_5^S$ of the write address aS. If there is reading from memory, then the bits A1 to A5 correspond to the transformed bits $A_1^L$ to $A_5^L$ of the read address aL.

In systematic form, the generator matrix Gsys of the code is $$G_{sys} = \begin{pmatrix} 0 & 1 & 0 & 1 & 1 & 1 & 0 & 0 & 0 & 0 & 0 & 0 & 0 & 0 \\ 1 & 0 & 1 & 0 & 1 & 0 & 1 & 0 & 0 & 0 & 0 & 0 & 0 & 0 \\ 1 & 1 & 0 & 0 & 1 & 0 & 0 & 1 & 0 & 0 & 0 & 0 & 0 & 0 \\ 0 & 0 & 1 & 1 & 1 & 0 & 0 & 0 & 1 & 0 & 0 & 0 & 0 & 0 \\ 1 & 1 & 1 & 1 & 1 & 0 & 0 & 0 & 0 & 1 & 0 & 0 & 0 & 0 \\ 0 & 1 & 1 & 1 & 0 & 0 & 0 & 0 & 0 & 0 & 1 & 0 & 0 & 0 \\ 1 & 0 & 1 & 1 & 0 & 0 & 0 & 0 & 0 & 0 & 0 & 1 & 0 & 0 \\ 0 & 1 & 1 & 0 & 1 & 0 & 0 & 0 & 0 & 0 & 0 & 0 & 1 & 0 \\ 1 & 1 & 0 & 1 & 0 & 0 & 0 & 0 & 0 & 0 & 0 & 0 & 0 & 1 \\ 1 & 0 & 0 & 1 & 1 & 0 & 0 & 0 & 0 & 0 & 0 & 0 & 0 & 1 \end{pmatrix} \quad (13)$$

In the example, the coder 12 is configured in such a way that it determines the check bits c1 to c5 for the used data bits x1 to x5 according to the G-matrix Gsym as per the relationships below $$c_1 = x_2 + x_3 + x_5 + A_2^S + A_4^S + A_5^S$$

$$c_2 = x_1 + x_3 + x_5 + A_1^S + A_3^S + A_4^S$$

$$c_3 = x_2 + x_4 + x_5 + A_1^S + A_2^S + A_2^S$$

$$c_4 = x_1 + x_4 + x_5 + A_1^S + A_2^S + A_4^S + A_5^S$$

$$c_5 = x_1 + x_2 + x_3 + x_4 + x_5 + A_3^S + A_5^S \quad (14)$$

and provides the bits c1, . . . , c5, x1, . . . , x5 at the output of the coder 12, wherein the bit combination $$c_1, \ldots, c_5, x_1, \ldots, x_5, A_1^S, \ldots, A_5^S$$

is a code word of the error code Ca.

In the error-free case, the bits c1, . . . , c5, x1, . . . , x5 are stored at the write address aS in the memory 11. The write address aS is present at the address input of the memory 11 and at the input of the address transformation circuit 13. The address transformation circuit 13 performs the address transformation f, with the address aS being transformed into the address bits $A_1^S, \ldots, A_5^S$. The address transformation f is explained in more detail below.

It is possible that the bits stored in the memory 11 are read at the address aL. In this case, the address aL is present at the address input of the memory 11 and, at the same time, at the address transformation circuit 14. The address transformation circuit 14 performs the address transformation f, with the address aL being transformed into the address bits $A_1^L, \ldots, A_5^L$.

The memory 11 provides, e.g., at data output lines provided to this end, possibly incorrect bits $$c'1, \ldots, c'5, x'1, \ldots, x'5 = v'1, \ldots, v'10 = v',$$

which are also referred to as possibly incorrect bitstream v'.

The first input of the corrector 15 is connected to the output of the address transformation circuit 14 and the second input of the corrector 15 is connected to the output of the memory 11. The corrector 15 is configured in such a way that it forms, at its output, a correction signal e1, . . . , e10 for correcting the possibly incorrect bitstream v' and provides this to the second input of the XOR circuit 17. The first input of the XOR circuit 17 is connected to the output of the memory 11. At its output, the XOR circuit 17 provides the corrected bits:

$$v^{cor} = v_1^{cor}, \ldots, v_{10}^{cor} =$$
$$= c_1^{cor}, \ldots, c_5^{cor}, x_1^{cor}, \ldots, x_5^{cor} =$$
$$= c'_1 + e_1, \ldots, c'_5 + e_{5} + x'_1 + e_6, \ldots, x'_5 + e_{10}.$$

The first input of the error detection circuit 16 is connected to the output of the address transformation circuit 14 and the second input of the error detection circuit 16 is connected to the output of the memory 11. The error detection circuit 16 is configured in such a way that it forms, at its output, an error signal E on the basis of the transformed address bits $A_1^L, \ldots, A_5^L$ and the possibly incorrect bitstream v' read from the memory 11.

Figure 2:
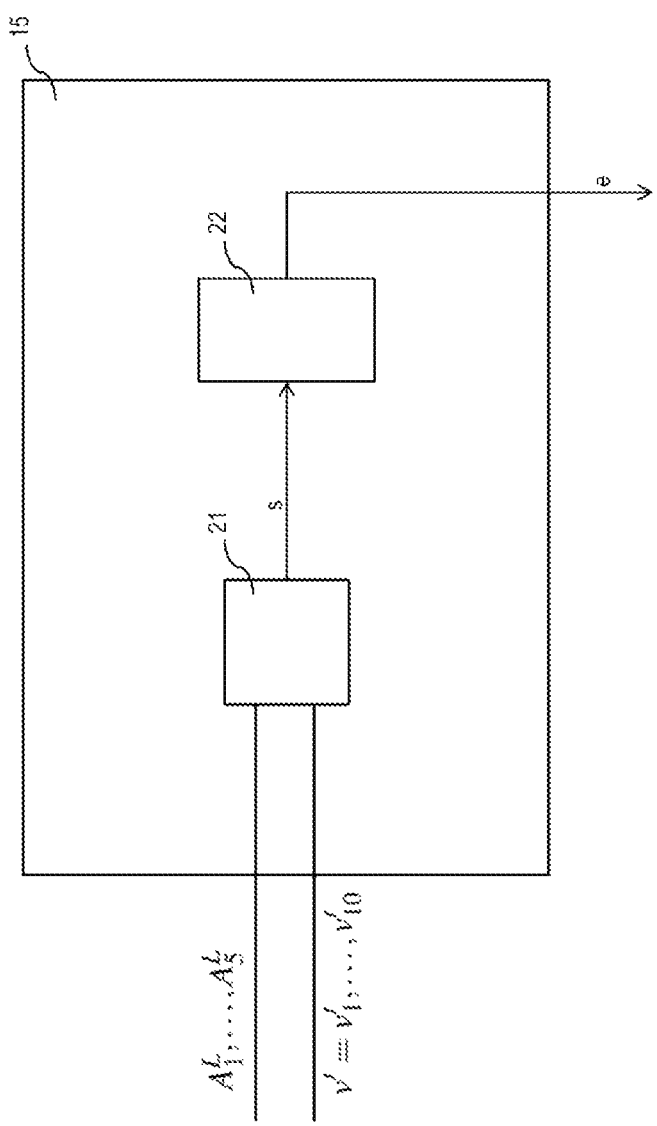
FIG. 2 shows an example realization of the corrector of FIG. 1.

FIG. 2 shows an example realization of the corrector 15. According to the example shown here, the corrector 15 is proposed as a series connection of a syndrome generator 21 and a decoder 22.

By way of example, the syndrome generator 21 can be configured in such a way that, depending on transformed possibly incorrect address bits $A_1^L, \ldots, A_5^L$ and the possibly incorrect bitstream v' read from the memory 11, present at its inputs, it determines an error syndrome s=[s1, s2, s3, s4, s5] corresponding to the H-matrix $H=[H_{m,n}^v, I_m]$ from equation (11) as per $$s_1 = c'_1 + c'_4 + x'_1 + x'_2 + x'_3 + x'_4 + A_1^L$$

$$s_2 = c'_2 + c'_4 + c'_5 + x'_1 + x'_2 + x'_5 + A_2^L$$

$$s_3 = c'_1 + c'_2 + c'_3 + c'_5 + x'_2 + x'_3 + A_4^L$$

$$s_4 = c'_3 + c'_4 + c'_5 + x'_3 + x'_4 + x'_5 + A_4^L$$

$$s_5 = c'_1 + c'_2 + c'_3 + x'_1 + x'_4 + x'_5 + A_5^L \quad (15)$$

and provides said error syndrome at its output.

The output of the syndrome generator 21 is connected to a five bit wide input of a decoder 22, which forms the 10 bit wide correction signal $$e = e1, \ldots, e10$$

for correcting the bits $$c'1, c'2, c'3, c'4, c'5, x'1, x'2, x'3, x'4, x'5$$

and provides the former at its output.

Figure 3:
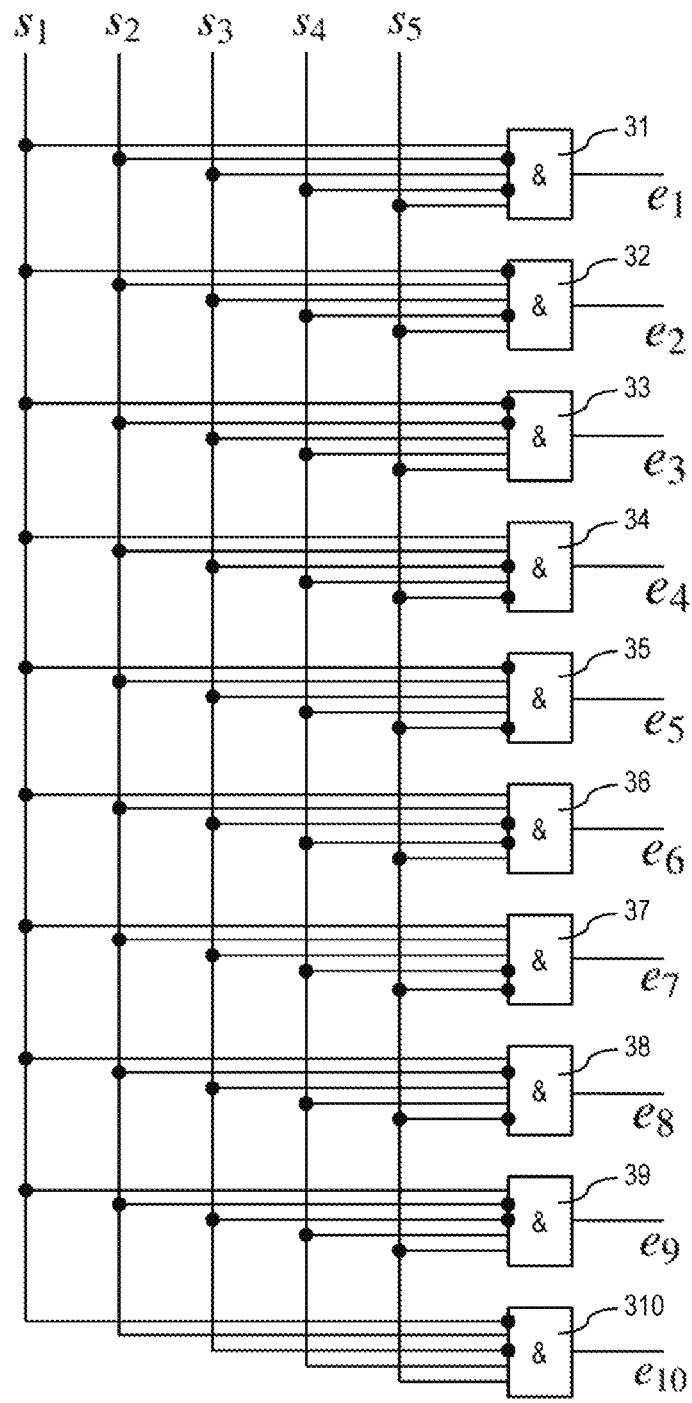
FIG. 3 shows an example implementation of the decoder from FIG. 2.

FIG. 3 shows an example implementation of the decoder 22 using ten AND gates 31, 32, 33, 34, 35, 36, 37, 38, 39, 310, with each of these AND gates having five inputs and one output.

As shown in FIG. 2, the decoder 22 receives the error syndrome s with the (error syndrome) components s1 to s5 at its input.

The component s1 is connected (in noninverting fashion) to the first inputs of the AND gates 31, 34, 36, 37, 38 and 39. Furthermore, the inverted component s1 is connected to the first inputs of the AND gates 32, 33, 35 and 310.

The component s2 is connected (in noninverting fashion) to the second inputs of the AND gates 32, 34, 35, 36, 37 and 310. Furthermore, the inverted component s2 is connected to the second inputs of the AND gates 31, 33, 38 and 39.

The component s3 is connected (in noninverting fashion) to the third inputs of the AND gates 31, 32, 33, 35, 37 and 38. Furthermore, the inverted component s3 is connected to the third inputs of the AND gates 34, 36, 39 and 310.

The component s4 is connected (in noninverting fashion) to the fourth inputs of the AND gates 33, 34, 35, 38, 39 and 310. Furthermore, the inverted component s4 is connected to the fourth inputs of the AND gates 31, 32, 36 and 37.

The component s5 is connected (in noninverting fashion) to the fifth inputs of the AND gates 31, 32, 33, 36, 39 and 310. Furthermore, the inverted component s5 is connected to the fifth inputs of the AND gates 34, 35, 37 and 38.

The correction value e1 is provided at the output of the AND gate 31, the correction value e2 is provided at the output of the AND gate 32, the correction value e3 is provided at the output of the AND gate 33, the correction value e4 is provided at the output of the AND gate 34, the correction value e5 is provided at the output of the AND gate 35, the correction value e6 is provided at the output of the AND gate 36, the correction value e7 is provided at the output of the AND gate 37, the correction value e8 is provided at the output of the AND gate 38, the correction value e9 is provided at the output of the AND gate 39 and the correction value e10 is provided at the output of the AND gate 310.

Figure 4:
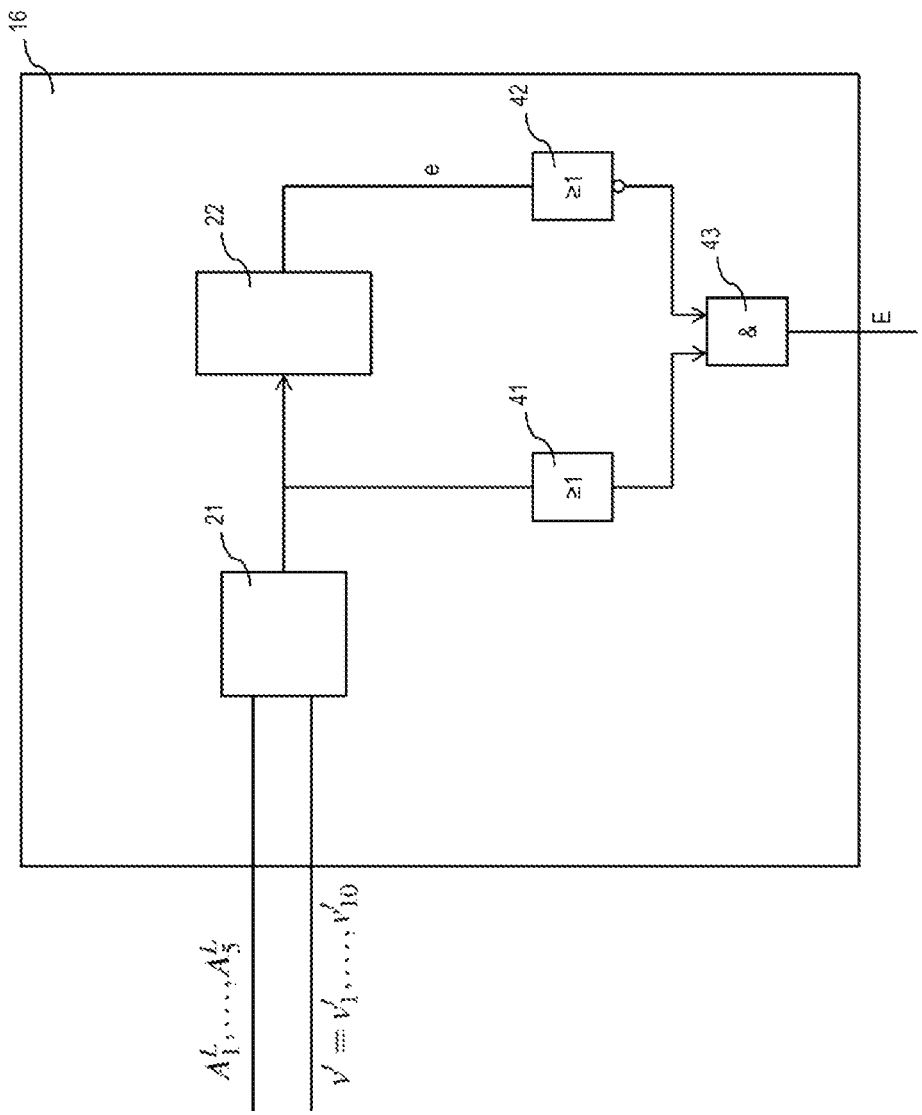
FIG. 4 shows an example implementation of the error detection circuit from FIG. 1.

FIG. 4 shows a possible implementation of the error detection circuit 16.

By way of example, the error detection circuit 16 is configured in such a way that it provides an error signal E=0 if an error that is correctable by the error code Ca is present or if no error is present. By contrast, the error detection circuit 16 supplies an error signal E=1 if an error that is not correctable by the error code Ca is present. In one embodiment, address errors should be detected with a probability that is as high as possible.

The error detection circuit 16 comprises a syndrome generator which may be embodied in accordance with the syndrome generator 21. Furthermore, the error detection circuit 16 comprises a decoder which may be embodied in accordance with the decoder 22. Additionally, the error detection circuit 16 also comprises
- an OR gate 41 with a five bit wide input and an output,
- a NOR gate 42 with a ten bit wide input and an output and
- an AND gate 43 with two inputs and an output.

The error signal E is provided at the output of the AND gate 43.

The output of the syndrome generator 21 shown in FIG. 4 is connected to the input of the OR gate 41 and to the input of the decoder 22. The output of the decoder 22 supplies the correction signal e and is connected to the input of the NOR gate 42. The output of the OR gate 41 is connected to the first input of the AND gate 43 and the output of the NOR gate 42 is connected to the second input of the AND gate 43.

The OR gate 41 forms the logic combination $$s_1 \vee s_2 \vee s_3 \vee s_4 \vee s_5$$

of the components s1 to s5 present at its input and the NOR gate 43 forms the logic combination $$\overline{e_1 \vee e_2 \vee ... \vee e_{10}}$$

of the correction values e1 to e10 present at its input. The AND gate 43 forms the error signal E as follows:

$$E = (s_1 \vee s_2 \vee s_3 \vee s_4 \vee s_5) \wedge \overline{(e_1 \vee e_2 \vee ... \vee e_{10})} \quad (16)$$

If no error is present, the error syndrome is:

$$s = s_1, s_2, s_3, s_4, s_5 = 0,0,0,0,0.$$

From this, $$(s_1 \vee s_2 \vee s_3 \vee s_4 \vee s_5) = 0$$

follows and, according to equation (16), E=0 arises. In this case, no error is indicated.

If there is a 1-bit error bi of the i-th component of the bitstream v'=v'1, . . . , v'10, which is corrected by the error code Ca, then the correction signal determined by the decoder is $$e(b_i) = \underbrace{(0, ... 0, 1, 0, ..., 0)}_{i} \neq 0$$

and the NOR gate 42 outputs a value of 0 at its output, as a result of which E=0 arises as the error signal at the output of the AND gate 43.

Consequently, the error signal E equals 0 if the error syndrome is s=0 or if an error that is correctable by the error code Ca is present. In the example explained here, this is the 1-bit error in the bitstream v'.

By way of example, the error detection circuit 16 and the corrector 15 can be implemented together or separately. In an example implementation, provision can be made of a single syndrome generator 21, which is used both for the corrector 15 and for the error detection circuit 16. Accordingly, provision can be made of one decoder 22 or of a plurality of decoders 22.

It is also possible to realize the transformation circuits 13 and 14 by means of a single physical implementation. By way of example, a single transformation circuit can be employed with the use of at least one multiplexer in order to provide the function of the transformation circuits 13 and 14.

Address Transformation

The determination of the address transformation f, as may be realized in the address transformation circuits 13 and 14, for example, is explained in more detail below.

An addressable memory with 64 addresses 0, 1, 2, . . . , 63 is considered. Consequently, an address can be represented by means of six bits $$a = a1, ..., a6.$$

Binary representations of the addresses 0 to 63 are, as is conventional, 000000,000001,000010,000011,000100, . . . ,111111.

By way of example, N=10 is considered. In this example, the 10 possible correctable errors are the 1-bit errors b1, . . . , b10 in the bitstream v' made of 10 bits (with the five check bits c'1, . . . , c'5 and the five used data bits x'1, . . . , x'5).

The associated error vectors are the 15 digit vectors $$[1 \; \underbrace{0 ... 0}_{9} \; 00000],$$

$$[01 \; \underbrace{0 ... 0}_{8} \; 00000],$$

$$\vdots$$

$$[\underbrace{0 ... 0}_{9} \; 100000].$$

The respective five last components of the error vectors, which correspond to the transformed address values, equal 0. The corresponding error syndromes are $$s(b_1) = [10101]^T = H_{5,10}^v \cdot e^1$$

$$s(b_2) = [01101]^T = H_{5,10}^v \cdot e^2$$

$$s(b_3) = [00111]^T = H_{5,10}^v \cdot e^3$$

$s(b_4)=[11010]^T=H_{5,10}^v \cdot e^4$ $s(b_5)=[01110]^T=H_{5,10}^v \cdot e^5$ $s(b_6)=[11001]^T=H_{5,10}^v \cdot e^6$ $s(b_7)=[11100]^T=H_{5,10}^v \cdot e^7$ $s(b_8)=[10110]^T=H_{5,10}^v \cdot e^8$ $s(b_9)=[10011]^T=H_{5,10}^v \cdot e^9$ $s(b_{10})=[01011]^T=H_{5,10}^v \cdot e^{10}$ \hfill (17)

where $H_{5,10}^v$ is determined by equation (11).
The case is considered where the error memory cell errors $\varphi^1 =$ All-0 and $\varphi^2 =$ All-1 should be detected.
The following applies:

$$H_{5,10}^v \cdot \varphi^1 = H_{5,10}^v \cdot [\underbrace{0 \ldots 0}_{10}]^T = [00000]^T \text{ and} \quad (18)$$

$$H_{5,10}^v \cdot \varphi^2 = H_{5,10}^v \cdot [\underbrace{1 \ldots 1}_{10}]^T = [00000]^T. \quad (19)$$

The address transformation f is determined in such a way that the transformed address values f(a)=A1, ..., A5 for any one of the 64 addresses according to equation (1) differ from the following 11 values:

$$\{H_{5,10}^v \cdot \varphi^1, H_{5,10}^v \cdot \varphi^1 + s(b_1), \ldots, H_{5,10}^v \cdot \varphi^1 + s(b_{10})\} = \{[00000]^T, [10101]^T, [01101]^T, [00111]^T, [11001]^T, [01110]^T, [11001]^T, [11100]^T, [10110]^T, [10011]^T, [01011]^T\} \quad (20)$$

Moreover, the address transformation f is determined in such a way that the transformed address values A1 to A5 for any one of the 64 addresses differs from the following 11 values:

$$\{H_{5,10}^v \cdot \varphi^2, H_{5,10}^v \cdot \varphi^2 + s(b_1), \ldots, H_{5,10}^v \cdot \varphi^2 + s(b_{10})\} \quad (21)$$

According to equations (18) and (19), the following applies in example fashion:

$H_{5,10}^v \cdot \varphi^2 = H_{5,10}^v \cdot \varphi^1$.

Consequently, the values determined in equations (20) and (21) do not differ.
There are $2^5=32$ possible 5-bit values available as a value range for the address transformation f. Of these 32 possible 5-bit values, $32-11=21$ 5-bit values remain, which are not equal to $[000000]^T$ and not equal to the error syndromes s(b1) to s(b10) according to equation (17).
An example is provided below as to how 21 transformed address values can be assigned to the 64 addresses on the basis of the address transformation f.

TABLE 1

Value table of a first address transformation f(a)

| $A_1A_2A_3A_4A_5$ = f(a) | a | a | a | a |
|---|---|---|---|---|
| 00001 | 0 | 21 | 42 | 63 |
| 00010 | 1 | 22 | 43 | |
| 00011 | 2 | 23 | 44 | |
| 00100 | 3 | 24 | 45 | |
| 00101 | 4 | 25 | 46 | |
| 00110 | 5 | 26 | 47 | |
| 01000 | 6 | 27 | 48 | |
| 01001 | 7 | 28 | 49 | |
| 01010 | 8 | 29 | 50 | |
| 01100 | 9 | 30 | 51 | |
| 01111 | 10 | 31 | 52 | |
| 10000 | 11 | 32 | 53 | |
| 10001 | 12 | 33 | 54 | |
| 10010 | 13 | 34 | 55 | |
| 10100 | 14 | 35 | 56 | |
| 10111 | 15 | 36 | 57 | |
| 11000 | 16 | 37 | 58 | |
| 11011 | 17 | 38 | 59 | |
| 11101 | 18 | 39 | 60 | |
| 11110 | 19 | 40 | 61 | |
| 11111 | 20 | 41 | 62 | |

According to the first row of table 1, addresses 0, 21, 42 and 63 are mapped to the transformed address bits 00001 by the address transformation f. According to the second row, the addresses 1, 22 and 43 are mapped to the transformed address bits 00010, and so on. Finally, the last of row of table 1 shows that the addresses 20, 41 and 62 are mapped to the transformed address bits 11111.

Table 2 shows a value table of a second address transformation. According to the first row of table 2, only the address 0 is mapped to the transformed address bits 00001 by the address transformation f. Every error that falsifies the address 0 to any other address leads accordingly to transformed address values that differ from the transformed address value 00001.

TABLE 2

Value table of a second address transformation f(a)

| $A_1A_2A_3A_4A_5$ = f(a) | a | a | a | a |
|---|---|---|---|---|
| 00001 | 0 | | | |
| 00010 | 1 | 22 | 43 | |
| 00011 | 2 | 23 | 44 | 63 |
| 00100 | 3 | 24 | 45 | 42 |
| 00101 | 4 | 25 | 46 | 21 |
| 00110 | 5 | 26 | 47 | |
| 01000 | 6 | 27 | 48 | |
| 01001 | 7 | 28 | 49 | |
| 01010 | 8 | 29 | 50 | |
| 01100 | 9 | 30 | 51 | |
| 01111 | 10 | 31 | 52 | |
| 10000 | 11 | 32 | 53 | |
| 10001 | 12 | 33 | 54 | |
| 10010 | 13 | 34 | 55 | |
| 10100 | 14 | 35 | 56 | |
| 10111 | 15 | 36 | 57 | |
| 11000 | 16 | 37 | 58 | |
| 11011 | 17 | 38 | 59 | |
| 11101 | 18 | 39 | 60 | |
| 11110 | 19 | 40 | 61 | |
| 11111 | 20 | 41 | 62 | |

An implementation in the form of an address transformation circuit of an address transformation described as a table can be realized using a synthesis tool, for example. By way of example, such an address transformation circuit can comprise a combinatorial circuit or read-only memory (ROM) or can be realized as one of these variants.

Increasing the Error Detection Probability

Example explanations are provided below as to how the error detection probability for address errors can be increased incrementally up to a desired error detection probability.

To this end, it is initially possible to modify the H-matrix $$H=[H_{m,n}^v, I_m]$$

of the error code Ca into a modified H-matrix $$H \bmod 1 = [H_{m+1,n}^v, I_{m+1}]$$

of an error code Ca1, wherein the matrix $H_{m+1,n}^v$ is formed from the matrix $H_{m,n}^v$ in such a way that an (m+1)-th row of n binary values, which can have n zeros, is added to the matrix $H_{m,n}^v$. Furthermore, the m-dimensional unit matrix Im can be replaced by an (m+1)-dimensional unit matrix Im+1.

The address transformation f is determined in such a way that the transformed (m+1)-component address values f(a)=A1, . . . , Am+1 for any possible memory address a differ from all (m+1)-component values (there being (N+1) such values)

$$H_{m+1,n}^v \cdot \varphi^1, H_{m+1,n}^v \cdot \varphi^1 + s(b_1), \ldots, H_{m+1,n}^v \cdot \varphi^1 + s(b_N). \quad (22)$$

In this respect, equation (22) shows a difference to equation (1).

The (m+1)-dimensional vectors $$\{H_{m+1,n}^v \cdot \varphi^1, H_{m+1,n}^v \cdot \varphi^1 + s(b_1), \ldots, H_{m+1,n}^v \cdot \varphi^1 + s(b_N)\}$$

are formed from the m-dimensional vectors $$\{H_{m,n}^v \cdot \varphi^1, H_{m,n}^v \cdot \varphi^1 + s(b_1), \ldots, H_{m,n}^v \cdot \varphi^1 + s(b_N)\}$$

by virtue of a 0 being appended to each of these vectors. Instead of the (2 m−N−1) possible values for the transformed address values of the error code Ca, (2 m+1−N−1) possible values for the transformed address values arise, as a result of which the relative number of non-detectable address errors reduces.

In a next step, it is possible to modify the H-matrix $$H \bmod 1 = [H_{m+1,n}^v, I_{m+1}]$$

of the error code Ca1 into a modified H-matrix $$H \bmod 2 = [H_{m+2,n}^v, I_{m+2}]$$

of an error code Ca2, wherein the matrix $H_{m+2,n}^v$ is formed from the matrix $H_{m+1,n}^v$ in such a way that an (m+2)-th row of n binary values, which can have n zeros, is added to the matrix $H_{m+1,n}^v$. Furthermore, the (m+1)-dimensional unit matrix Im+1 can be replaced by an (m+2)-dimensional unit matrix Im+2.

The address transformation f is determined in such a way that the transformed (m+2)-component address values f(a)=A1, . . . , Am+2 for any possible memory address a differ from all (m+2)-component values (there being (N+1) such values)

$$H_{m+2,n}^v \cdot \varphi^1, H_{m+2,n}^v \cdot \varphi^1 + s(b_1), \ldots, H_{m+2,n}^v \cdot \varphi^1 + s(b_N). \quad (23)$$

In this respect, reference is made to the difference in equations (22) and (23).

The (m+2)-dimensional vectors $$\{H_{m+2,n}^v \cdot \varphi^1, H_{m+2,n}^v \cdot \varphi^1 + s(b_1), \ldots, H_{m+2,n}^v \cdot \varphi^1 + s(b_N)\}$$

are determined from the (m+1)-dimensional vectors $$\{H_{m+1,n}^v \cdot \varphi^1, H_{m+1,n}^v \cdot \varphi^1 + s(b_1), \ldots, H_{m+1,n}^v \cdot \varphi^1 + s(b_N)\}$$

by virtue of a 0 being appended to each of these vectors. Instead of the 2 m+1−N−1 possible values for the transformed address bits of the error code, 2 m+2−N−1 possible values for the transformed address values now arise, as a result of which the relative number of non-detectable address errors reduces further.

Accordingly, the H-matrix can be further modified (incrementally) in order to successively increase the error detection probability for address errors.

In relation to the example explained here with the H-matrix as per the equation (11), a modified H-matrix of the error code Ca1 arises from a first modification as per the explanations above:

$$H^{mod1} = (H_{6,10}^v, I_6) = \begin{pmatrix} 1 & 0 & 0 & 1 & 0 & 1 & 1 & 1 & 1 & 0 & 1 & 0 & 0 & 0 & 0 & 0 \\ 0 & 1 & 0 & 1 & 1 & 1 & 1 & 0 & 0 & 1 & 0 & 1 & 0 & 0 & 0 & 0 \\ 1 & 1 & 1 & 0 & 1 & 0 & 1 & 1 & 0 & 0 & 0 & 0 & 1 & 0 & 0 & 0 \\ 0 & 0 & 1 & 1 & 1 & 0 & 0 & 1 & 1 & 1 & 0 & 0 & 0 & 1 & 0 & 0 \\ 1 & 1 & 1 & 0 & 0 & 1 & 0 & 0 & 1 & 1 & 0 & 0 & 0 & 0 & 1 & 0 \\ 0 & 0 & 0 & 0 & 0 & 0 & 0 & 0 & 0 & 0 & 0 & 0 & 0 & 0 & 0 & 1 \\ c_1 & c_2 & c_3 & c_4 & c_5 & x_1 & x_2 & x_3 & x_4 & x_5 & A_1 & A_2 & A_3 & A_4 & A_5 & A_6 \end{pmatrix}. \quad (24)$$

A second modification leads to a further modified H-matrix $$H^{mod2} = (H_{7,10}^v, I_7) = \begin{pmatrix} 1 & 0 & 0 & 1 & 0 & 1 & 1 & 1 & 1 & 0 & 1 & 0 & 0 & 0 & 0 & 0 & 0 \\ 0 & 1 & 0 & 1 & 1 & 1 & 1 & 0 & 0 & 1 & 0 & 1 & 0 & 0 & 0 & 0 & 0 \\ 1 & 1 & 1 & 0 & 1 & 0 & 1 & 1 & 0 & 0 & 0 & 0 & 1 & 0 & 0 & 0 & 0 \\ 0 & 0 & 1 & 1 & 1 & 0 & 0 & 1 & 1 & 1 & 0 & 0 & 0 & 1 & 0 & 0 & 0 \\ 1 & 1 & 1 & 0 & 0 & 1 & 0 & 0 & 1 & 1 & 0 & 0 & 0 & 0 & 1 & 0 & 0 \\ 0 & 0 & 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 0 & 0 & 1 \\ c_1 & c_2 & c_3 & c_4 & c_5 & x_1 & x_2 & x_3 & x_4 & x_5 & A_1 & A_2 & A_3 & A_4 & A_5 & A_6 & A_7 \end{pmatrix} \quad (25)$$

of the error code Ca2.

EXAMPLE

An addressable memory with 1024 addresses is considered in example fashion.

The H matrix $H = H_{5,10}{}^v, I_5$ of the error code Ca as per equation (11) has five rows and hence five check bits and five bits A1 to A5 of transformed address values. The address transformation f maps the 1024 possible addresses (ten bits) to these five bits of transformed address values f(a).

The Set $$\{H_{5,10}{}^v \cdot \varphi^1, H_{5,10}{}^v \cdot \varphi^1 + s(b^1), \ldots, H_{5,10}{}^v \cdot \varphi^1 + s(b^{10})\} = \{0, s(b^1), \ldots, s(b^{10})\}$$

with $H_{5,10}{}^v \cdot \varphi^1 = 0$ has 11 five-dimensional values or occupancies which are not available as possible 5-bit transformed address values f(a). Hence, the address transformation f is determined in such a way that the transformed address values f(a) for each of the addresses a from $\{0, 1, \ldots, 1023\}$ is not equal to these 11 values and consequently can adopt $2^5 - 11 = 21$ different values. Consequently, the value range of the address transformation f comprises 21 values.

These 21 different values can be used as transformed address values f(a).

It is possible to assign respectively 48 or 49 addresses of the used memory to each of these 21 different values since $$21 \cdot 49 = 1029 > 1024 > 1008 = 21 \cdot 48$$

applies. Consequently, no more than 49 addresses and at least 48 addresses are mapped to a transformed address.

For an address a, there are 1023 possible address errors that could falsify the address a to any other address. By way of example, the assumption is made that each possible address error occurs with the same probability.

The probability P(a,a')det of an address error being detected is consequently determined as $$P(a, a')_{det} \geq 1 - \frac{11}{2^5 - 11} = 1 - \frac{11}{21} = 0.476$$

i.e., approximately 48%.

Should this error detection probability be insufficient, the error code Ca with the H-matrix as per equation (11) can be replaced by the error code Ca1 with the H-matrix as per equation (24) with 6 check bits.

The H matrix $H^{mod1} = H_{6,10}{}^v, I_6$ has six rows and hence six check bits and six bits A1 to A6 of transformed address values, to which the 1024 addresses are transformed by the address transformation f.

The set $$\{H_{6,10}{}^v \cdot \varphi^1, H_{6,10}{}^v \cdot \varphi^1 + s(b^1), \ldots, H_{6,10}{}^v \cdot \varphi^1 + s(b^{10})\} = \{0, s(b^1), \ldots, s(b^{10})\}$$

with $H_{6,10}{}^v \cdot \varphi^1 = 0$ now has 11 six-dimensional values or occupancies. The address transformation f is determined in such a way that the transformed address value f(a) for each of the addresses a is not equal to these 11 values. The value range of the address transformation f consequently comprises $2^6 - 11 = 53$ different values, which can be used as transformed address values.

It is possible to assign respectively 19 or 20 addresses of the used memory to each of these 53 different values since $$53 \cdot 20 = 1060 > 1024 > 53 \cdot 19 = 1007$$

applies. Consequently, no more than 20 addresses and at least 19 addresses are mapped to a transformed address.

The probability P(a,a')det of an address error being detected is consequently determined as $$P(a, a')_{det} \geq 1 - \frac{11}{2^6 - 11} = 1 - \frac{11}{53} = 0.792$$

i.e., approximately 79%.

Should this error detection probability also be insufficient, the error code Ca1 with the H-matrix as per equation (24) can be replaced in a next step by the error code Ca2 with the H-matrix as per equation (25) with 7 check bits.

The H matrix $H^{mod2} = H_{7,10}{}^v, I_7$ has seven rows and hence seven check bits and seven bits A1 to A7 of transformed address values, to which the 1024 addresses are transformed by the address transformation f.

The Set $$\{H_{7,10}{}^v \cdot \varphi^1, H_{7,10}{}^v \cdot \varphi^1 + s(b^1), \ldots, H_{7,10}{}^v \cdot \varphi^1 + s(b^{10})\} = \{0, s(b^{10})\}$$

with $H_{7,10}{}^v \cdot \varphi^1 = 0$ now has 11 seven-dimensional values or occupancies. The address transformation f is determined in such a way that the transformed address value f(a) for each of the addresses a is not equal to these 11 values. The value range of the address transformation f consequently comprises $2^7 - 11 = 117$ different values, which can be used as transformed address values.

It is possible to assign respectively 8 or 9 addresses of the used memory to each of these 117 different values since $$117 \cdot 9 = 1053 > 1024 > 117 \cdot 8 = 936$$

applies. Consequently, no more than 8 addresses and at least 7 addresses are mapped to a transformed address.

The probability P(a,a')det of an address error being detected is consequently determined as $$P(a, a')_{det} \geq 1 - \frac{11}{2^7 - 11} = 1 - \frac{11}{117} = 0.906$$

i.e., approximately 90%.

Should this error detection probability still not suffice, the H-matrix can be modified further in analogous fashion in corresponding further steps until the desired error detection probability for address errors is reached.

Memory Cell Error

How a memory cell error is detected is explained below.

The all-0 memory cell error is used as an example of a memory cell error. The read address aL is present at the address input of the memory 11 from FIG. 1 and at the input of the address transformation circuit 14. The address transformation circuit 14 forms the transformed address values $$f(a^L) = A_1^L, A_2^L, A_3^L, A_4^L, A_5^L,$$

which are present at the first input of the corrector 15. On account of the all-0 error, the memory 11 provides at its output the bitstream $$v' = \underbrace{0, \ldots, 0}_{10},$$

which is present at the second input of the corrector 15.

As shown in FIG. 2, the corrector 15 is embodied as a series connection of syndrome generator 21 and decoder 22. The transformed address bits $A_1^L$ to $A_5^L$ are present at the first input of the syndrome generator 21 and the bitstream v' is present at its second input. The syndrome generator 21 is configured in such a way that, for the transformed address bits $$A_1^L, A_2^L, A_3^L, A_4^L, A_5^L,$$

it forms, in accordance with equation (15), the error syndrome $$s_1 = A_1^L$$

$$s_2 = A_2^L$$

$$s_3 = A_3^L$$

$$s_4 = A_4^L$$

$$s_5 = A_5^L \quad (26)$$

and outputs the latter at its output. As shown in FIG. 4, this output of the syndrome generator 21 is connected to the input of the decoder 22 and to the input of the OR gate 41.

The address transformation circuit 14 is configured in such a way that the transformed address values of each possible address are not equal to the error syndromes of the correctable errors in the bitstream v' and not equal to the value 00000. The decoder 22 outputs the correction value $$e = \underbrace{0, \ldots, 0}_{10},$$

which is fed to the input of the NOR gate 42.

At its output, the NOR gate 42 provides a value of 1, which is fed to the AND gate 43. Since the error syndrome provided by the syndrome generator 21 is not equal to 00000, the OR gate 41 provides a value of 1 at its output, said value likewise being provided to the AND gate 43. Consequently, the AND gate 43 outputs the error signal E=1 at its output, which, as a result, confirms that a non-correctable error has occurred, and so the memory cell error all-0 is detected as a non-correctable error.

If no error is present or a correctable error has occurred, the error signal E at the output of the AND gate 43 equals 0.

The invention claimed is:

1. A method for detecting an address error when reading a bitstream from a memory, comprising:
   checking whether the bitstream combined with a transformation of a present read address is a code word of an error code,
   when the bitstream combined with the transformation of the present read address is not a code word of the error code, detecting and/or correcting an address error; and
   detecting and/or correcting a memory cell error in the bitstream, when present, using the error code when the present read address is a code word of the error code.

2. The method as claimed in claim 1, wherein the memory cell error to be corrected by the error code is a subset of the errors correctable by the error code.

3. The method as claimed in claim 1, wherein no address error is detected if the bitstream combined with the transformation of the present read address is a code word of the error code.

4. The method as claimed in claim 1, wherein the memory cell error is detected and/or corrected using a first error syndrome.

5. The method as claimed in claim 4, wherein the address error is detected using a second error syndrome, the first error syndrome differing from the second error syndrome.

6. The method as claimed in claim 1, wherein, before reading the bitstream from the memory, performing the following acts to represent the bitstream combined with the transformation of the present read address:
   storing a bitstream vat an address a in the memory, the bitstream v and an address value f(a) transformed by means of a transformation f representing a code word of the error code, and
   assigning the used memory address a to the transformed address value $f(a) = A_1, \ldots, A_m$, where the transformed address value f(a) is different from an error syndrome of the memory cell error and different from values arising from error syndromes assigned to bit errors.

7. The method as claimed in claim 6, wherein not all addresses of the memory are used.

8. The method as claimed in claim 1, wherein the memory has memory cells, in which n-component bitstreams are storable, wherein N different bit errors $b_1$ to $b_N$, which falsify a bitstream $v = v1, \ldots, vn$ into bitstreams $v(b_1), v(b_2), \ldots, V(b_N)$, are correctable, wherein a memory cell error $\varphi^1$, in which n memory cells yield the values $\varphi_1^1, \ldots, \varphi_n^1 = \varphi^1$ upon readout from the memory cells, is detected,
   determining the bitstream v, which is written into the memory at an address a, such that in an error-free case is a code word of the error code Ca with an H-matrix $H = (H_{m,n}^v, I_m)$, and
   determining an address transformation f such that it uniquely assigns a transformed address value $f(a) = A_1, \ldots, A_m$, to each used memory address a, which transformed address value is not equal to the values $$H_{m,n}^v \cdot \varphi^1, H_{m,n}^v \cdot \varphi^1 + s(b^1), \ldots, H_{m,n}^v \cdot \varphi^1 + s(b^N)$$

where s(bi) to s(bN) are error syndromes assigned to the bit errors, wherein the following relationships apply:

$$2^m > N+1, n \geq 2, m \geq 2, N \geq 1$$

where $H_{m,n}^v$ denotes a binary (m,n)-matrix and in, denotes the m-dimensional unit matrix, and
   wherein the combination of the bitstream v and the transformed address value f(a) is the combination of the bitstream and the transformation of the present read address.

9. The method as claimed in claim 8, wherein a further memory cell error $\varphi^2$ is detected, where n memory cells addressed at one address yield the values $\varphi_1^2, \ldots, \varphi_n^2 = \varphi^2$ when reading from the memory cells, and the address transformation f is determined in such a way that the transformed address value f(a) for each used memory address a is not equal to the values $$H^v \cdot \varphi^2, H^v \cdot \varphi^2 + s(b^1), \ldots, H^v \cdot \varphi^2 + s(b^N).$$

10. The method as claimed in claim 8, wherein the matrix $H_{m,n}^v$ is an H-matrix of a Hamming code or a shortened Hamming code.

11. The method as claimed in claim 8, wherein the matrix $H_{m,n}^v$ is an H-matrix of a Hsiao code or a shortened Hsiao code.

12. The method as claimed in claim 8, wherein the matrix $H_{m,n}^v$ is an H-matrix of a t bit error correcting code.

13. The method as claimed in claim 8, wherein the matrix $H_{m,n}^v$ is an H-matrix of a BCH code.

14. The method as claimed in claim 8, wherein, for the purposes of increasing the probability of detecting an address error, the-H-matrix $$H=[H_{m,n}^v, I_m]$$

of an error code is changed into a modified H-matrix $$H=[H_{m+1,n}^v, I_{m+1}]$$

by virtue of an (m+1)-th row of n binary values being added to the matrix $H_{m,n}^v$.

15. The method as claimed in claim 14, wherein the (m+1)-th row, which is added to the matrix $H_{m,n}^v$, comprises n zeros.

16. An apparatus for detecting an address error, wherein the apparatus comprises:
- a processing unit to:
  - check whether a bitstream combined with a transformation of a present read address is a code word of an error code, and
  - when the bitstream combined with the transformation of the present read address is not a code word of the error code, detect and/or correct an address error.

17. The apparatus as claimed in claim 16, wherein the processing unit is configured to read the bitstream from a memory.

18. The apparatus of claim 16, further comprising detecting and/or correcting a memory cell error in the bitstream, when present, using the error code when the present read address is a code word of the error code.

19. A non-transitory computer program product which is directly loadable into a memory of a digital computer, comprising program code parts suitable for performing acts of a method, comprising:
- checking whether a bitstream combined with a transformation of a present read address is a code word of an error code,
- when the bitstream combined with the transformation of the present read address is not a code word of the error code, detecting and/or correcting an address error, and
- detecting and/or correcting a memory cell error in the bitstream, when present, using the error code when the present read address is a code word of the error code.

* * * * *